(12) United States Patent
Utsunomiya et al.

(10) Patent No.: US 6,426,468 B1
(45) Date of Patent: Jul. 30, 2002

(54) CIRCUIT BOARD

(75) Inventors: Hisanobu Utsunomiya; Tadahisa Tanaka, both of Chino (JP)

(73) Assignee: Kabushiki Kaisha Eastern, Nagano-ken (JP)

( * ) Notice: Subject to any disclaimer, the term of this patent is extended or adjusted under 35 U.S.C. 154(b) by 0 days.

(21) Appl. No.: 09/664,793

(22) Filed: Sep. 19, 2000

Related U.S. Application Data (62) Division of application No. 09/023,698, filed on Feb. 13, 1998.

(30) Foreign Application Priority Data

Feb. 14, 1997 (JP) ............................................. 9-030180

(51) Int. Cl.⁷ ................................................ H01R 9/09
(52) U.S. Cl. ........................ 174/261; 255/262; 361/800; 361/816; 439/88; 439/126
(58) Field of Search ................. 174/255, 261, 174/262; 361/800, 816, 111; 439/608, 88, 126

(56) References Cited

U.S. PATENT DOCUMENTS

| | | | |
|---|---|---|---|
| 5,288,949 A | * | 2/1994 | Crafts ......................... 174/250 |
| 5,371,404 A | | 12/1994 | Juskey et al. |
| 5,562,462 A | * | 10/1996 | Matsuba et al. ............ 439/608 |
| 5,583,376 A | | 12/1996 | Sickler et al. |
| 5,706,160 A | * | 1/1998 | Latuszkin et al. .......... 361/111 |
| 5,886,876 A | | 3/1999 | Yamaguchi |
| 6,183,301 B1 | * | 2/2001 | Paagman ..................... 439/608 |

* cited by examiner

*Primary Examiner*—Albert W. Paladini
(74) *Attorney, Agent, or Firm*—Birch, Stewart, Kolasch & Birch, LLP

(57) ABSTRACT

The circuit board of the present invention makes the length of the conductor patterns shorter and improves the electric performance for the high speed signal processing. The circuit board of the present invention, which comprises a substrate, is characterized in that the substrate includes: a first face on which conductor patterns, which will be connected to a semiconductor chip, are formed; a second face on which a plurality of pads, on which terminals are formed, are matrically formed; and plated through holes whose one end are respectively opened in the conductor patterns and whose the other ends are respectively opened in the pads, wherein inner faces of the plated through holes are coated with plating layers so as to respectively electrically connect the conductor patterns with the pad.

6 Claims, 9 Drawing Sheets

CIRCUIT BOARD

This application is a divisional of co-pending application Ser. No. 09/023,698, filed on Feb. 13, 1998, the entire contents of which are hereby incorporated by reference.

BACKGROUND OF THE INVENTION

The present invention relates to a circuit board, more precisely to a circuit board comprising a substrate, which includes: a first face (Top Layer) on which conductor patterns, which will be connected to a semiconductor chip, are formed; a second face (Bottom Layer) on which a plurality of pads, on which terminals are formed; and plated through holes whose inner faces are coated with plating layers so as to electrically connect the conductor patterns with the pads.

In conventional circuit boards (a circuit board whose both faces are covered with copper layers, a multilayer circuit board, a plastic ball grid array, a chip size package, etc.), conductor patterns are formed on the substrate in zigzag shapes.

Figure 9:
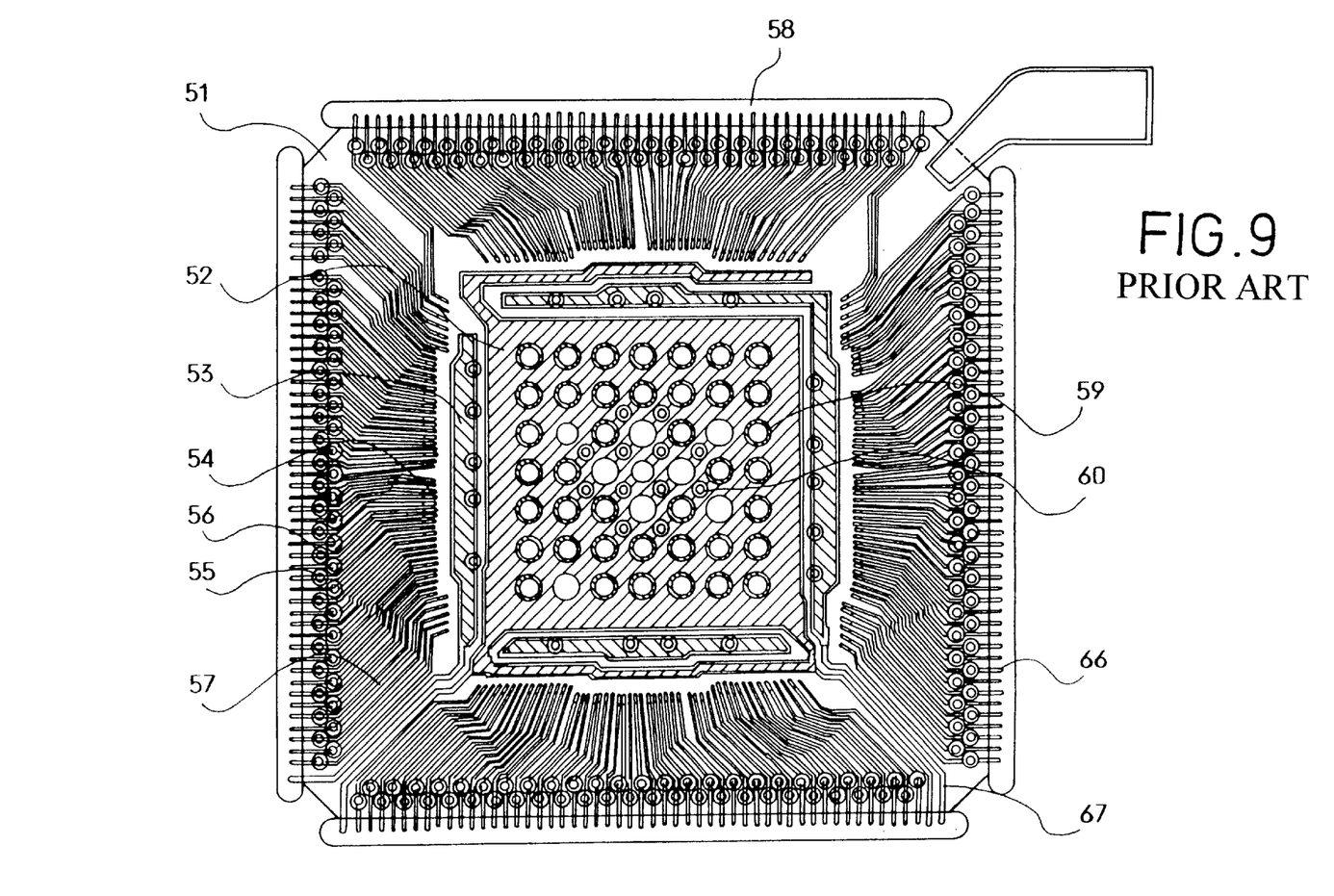
FIG. 9 is a plan view of the conventional circuit board.
Figure 10:
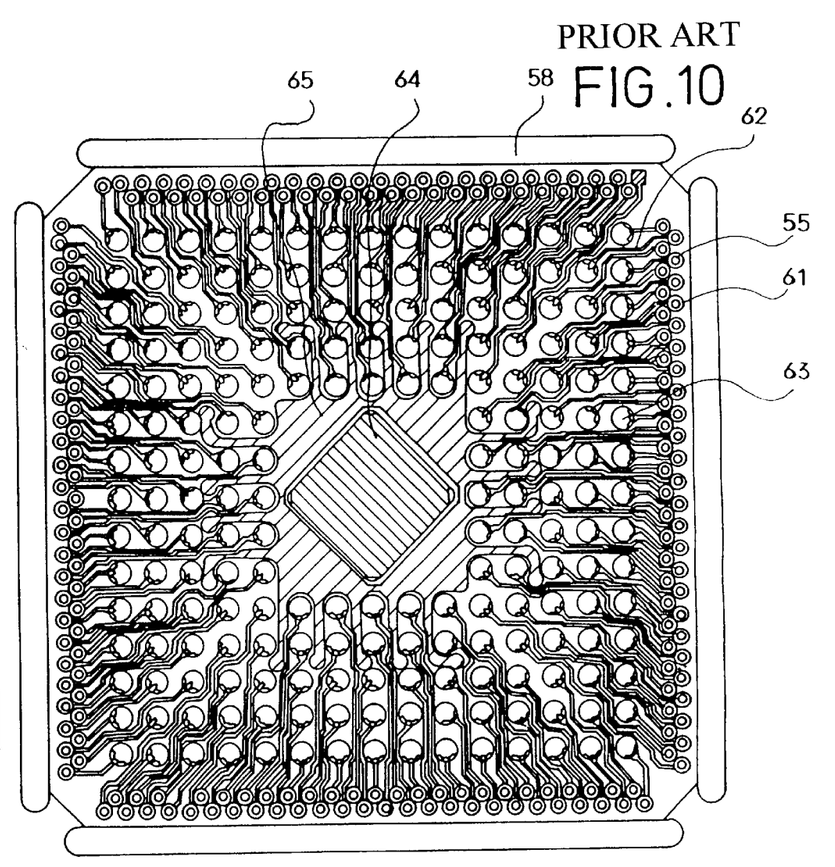
FIG. 10 is a bottom view of the conventional circuit board.

For example, the conductor patterns on both faces of the plastic ball grid array are shown in FIGS. 9 and 10. In FIG. 9, a die-pad 52 on which a semiconductor chip will be mounted is formed on an upper face of a substrate 51. A ground plane is formed in the die-pad 52 by nickel and gold plating, or the die-pad 52 is plated with copper, nickel and gold plating and partially coated with solder mask. Power plane 53, which are formed by nickel and gold plating, are provided to enclose the die-pad 52. Conductor patterns 57 include: signal lines connecting a plurality of lands 56, which are provided close to plated through holes 55 in outer edge sections of the substrate 51, with a plurality of connecting sections 54, to which inner leads of the semiconductor chip are connected; and ground plane. The conductor patterns 57 are formed into the zigzag shapes. The connecting sections 54 of the conductor patterns 57 are plated with nickel and gold plating.

Slot holes 58 are formed around each circuit board unit, so that the circuit board units can be separated one by one. The die-pad 52 has patterns 59 for tightly sticking the semiconductor chip and thermal holes 60 for dissipating heat of the semiconductor chip.

The plated through holes 55 are bored in a plastic substrate 51, whose thickness is about 400 $\mu$m, by a drill bit, whose diameter is about 300 $\mu$m. So diameter of the lands 56 should be 500 to 600 $\mu$m. If the drill bit diameter is 200 or 250 $\mu$m and is used to bore the plated through holes 55, the drill is apt to break and drilling time could be longer. In order to use the limited area as efficiently with a large number of the conductor patterns by conventional technologies which are mentioned herein above, the conductor patterns 57 must be formed into the zigzag patterns.

As shown in FIG. 10, each plated through hole 55 is opened in a bottom face of the substrate 51 as well as the upper face thereof. Conductor patterns 62 are extended from lands 61, which are provided around the plated through holes 55, toward the center of the substrate 51. There is formed a pad 63, on which a solder ball I/O terminal will be formed, at an inner end of each conductor pattern 62. The conductor patterns 62 are also formed into the zigzag shapes so as to make the conductor patterns shorter and form a large number of the conductor patterns in a limited area.

A copper layer is formed on a bottom face of the die-pad 52 by etching, and a heat sink 64 is fixed thereon to highly dissipate the heat of the semiconductor chip. To improve electric performance, there is formed a broad shield pattern 65 between the heat sink 64 and a pattern area in which the pads 63 are formed.

These days, processing speed of central processing units of computers are higher and higher. Thus, peripheral devices, for example, a graphic controller, a memory controller, are also required to operate at higher speed so as to synchronize with operating frequency of the high speed central processing unit.

The high speed central processing units whose operating frequency is more than 200 MHz have been used, and those whose operating frequency is more than 500 MHz are being studied now. So the electric performance of the circuit boards must be improved.

As shown in FIGS. 9 and 10, the conductor patterns 57 are extended from the connecting sections 54, which are close to the die-pad 52, to the plated through holes 55, which are located in the outer edge sections of the substrate 51; the conductor patterns 62 are extended from the plated through holes 55, which are located in the outer edge sections of the substrate 51, to the pads 63, which are located at inner parts of the substrate 51. The conductor patterns 57 and 62 are connected by the plated through holes 55. Further, the conductor patterns 57 and 62 are formed into the zigzag shapes, resulting in longer conductor length. Due to the longer length, it is difficult to adjust impedance between devices and the impedance characteristics of signal lines deteriorate.

In addition, a proper electromagnetic field cannot be generated, and high speed signal processing is limited.

Plating bars 66, which are formed on the lands 56 of the conductor patterns 57, and plating bar 67 of the die-pad 52 act as antennas and receive noises.

Since the diameter of the plated through holes 55 are limited, density of the conductor patterns on the substrate 51 is limited, and layout thereof is also limited. Furthermore, the number of the conductor patterns is limited in the limited area, so that the high speed signal processing is limited.

With the high speed signal processing, the exothermic value of the semiconductor chip must be increased. If the exothermic value is too great, the semiconductor chip will be damaged due to thermal yield. To avoid the thermal yield and thermal stress of the semiconductor chip, heat diffusivity of the circuit board must be increased.

These days, the semiconductor chip is driven by lower voltage, so threshold voltage is also set lower. Since the semiconductor chip is apt to be influenced by noises, which are generated in the circuit board or external devices, the characteristics of the lower threshold voltage semiconductor chip must be protected.

SUMMARY OF THE INVENTION

An object of the present invention is to provide a circuit board in which the length of the conductor patterns can be shorter.

Another object of the present invention is to provide a circuit board, which is capable of improving the electric performance for the high speed signal processing.

To achieve the object, the circuit board of the present invention, which comprises a substrate, is characterized in, that the substrate includes: a first face on which conductor patterns, which will be connected to a semiconductor chip, are formed; a second face on which a plurality of pads, on which terminals are formed, are matrically formed; and plated through holes whose one ends are respectively opened in the conductor patterns and the other ends are respectively opened in the pads, wherein inner faces of the plated through holes are coated with plating layers so as to respectively electrically connect the conductor patterns with the pads.

In the circuit board, the one ends of the plated through holes which connect the conductor patterns for clock signals with the corresponding pads may be opened in a connecting section of the conductor patterns to which inner leads of the semiconductor chip will be connected.

In the circuit board, the conductor patterns for the clock signals may be located close to the conductor pattern for shielding, which is connected to a ground plane.

In the circuit board, the conductor patterns may linearly connect connecting sections, to which the semiconductor chip is connected, with the one ends of the plated through holes.

In the circuit board, each pad may be enclosed by a metallic shield pattern.

In the circuit board, the conductor patterns may be enclosed by a metallic shield pattern, each pad may be enclosed by second metallic shield patterns and may be connected by a third metallic pattern, which is formed on a side face of the substrate.

In the circuit board, the terminals may be solder balls on the pads.

In the present invention, the inner faces of the through holes are coated with the plating layers, so that the conductor patterns are directly connected with the pads. With this structure, the conductor patterns can be linearly formed, and the conductor patterns can be made as short as possible. The length of the conductor patterns of the circuit board can be 50% or more shorter than that of the conventional circuit board. Further, no conductor patterns are formed in the second face of the substrate, so the impedance of the conductor patterns can be easily adjusted.

The one ends of the plated through holes are respectively opened in the conductor patterns as micro holes, so that clearance between the adjacent terminals can be shorter. By the micro holes, the width of the conductor patterns can be narrower, so that the impedance characteristic of the conductor patterns, as signal lines for high frequency signals, can be improved.

In the case that the one ends of the plated through holes which connect the conductor patterns for the clock signals with the corresponding pads are opened in the connecting sections and the conductor patterns for the clock signals are located close to the conductor pattern for shielding, the length of the conductor patterns can be made as short as possible and the electromagnetic field can be properly balanced, even if the conductor patterns for the clock signals are located close to each other, so that high frequency performance of the circuit board can be improved.

If the metallic shield pattern is provided on the second face of the substrate, a micro strip line structure can be formed between the conductor patterns on the first face and the shield patterns on the second face, so that the impedance characteristic of the circuit board can be improved. The metallic shield pattern can dissipate the heat of the semiconductor chip as a heat sink and prevents the substrate from bending itself.

If the first metallic shield pattern and the second metallic shield pattern are connected by the third metallic pattern, which is formed on the side face of the substrate, noises which are generated in the circuit board or external devices are shielded by the metallic patterns, and the signal characteristics of the semiconductor chip can be improved.

Further, no zigzag conductor patterns are formed on the first and the second faces, so that layout of the conductor pattern can be freely designed, a semiconductor chip having a large number of the I/O pads, which cannot be mounted on the conventional circuit boards, can be mounted, size of the substrate can be small, and manufacturing cost can be reduced.

BRIEF DESCRIPTION OF THE DRAWINGS

Embodiments of the present invention will now be described by way of examples and with reference to the accompanying drawings, in which.

DETAILED DESCRIPTION OF THE PREFERRED EMBODIMENTS

Preferred embodiments of the present invention will now be described in detail with reference to the accompanying drawings.

In the present embodiment, a circuit board for a plastic ball grid array will be explained.

Firstly, standard manufacturing steps of circuit boards will be explained. Copper foils are stuck on both sides of a plastic substrate by a press machine. Successively, a plurality of through holes are bored by a drilling and/or alternative methods. Then the inner face of the through holes are plated and coated by copper layers, so that the two sides of the substrate are electrically connected to each other. The copper layers are formed by electroless copper plating as a first plating layer and electrolytic copper plating as a second plating layer. Photo sensitive resist films are stuck on the both sides of the substrate. Photo masks, in which conductor patterns and pads are formed, are stuck on the both sides of the substrate. The photo sensitive films are exposed and developed to print the conductor patterns and the pads on the films. Copper layers which are not covered with the photo masks are removed by an etching manner so as to form the conductor patterns and the pads. Note that, in the case of a multilayer circuit board, a plurality of the substrates on which the conductor patterns are formed are integrated by heating and pressing with a prepreg. Solder mask is applied on parts other than the conductor patterns, and connecting sections to which the semiconductor chip is connected, the pads and a die-pad are plated by electroless nickel and gold plating.

Next, a structure of the circuit board will be explained with reference to FIGS. 1 and 2.

Figure 1:
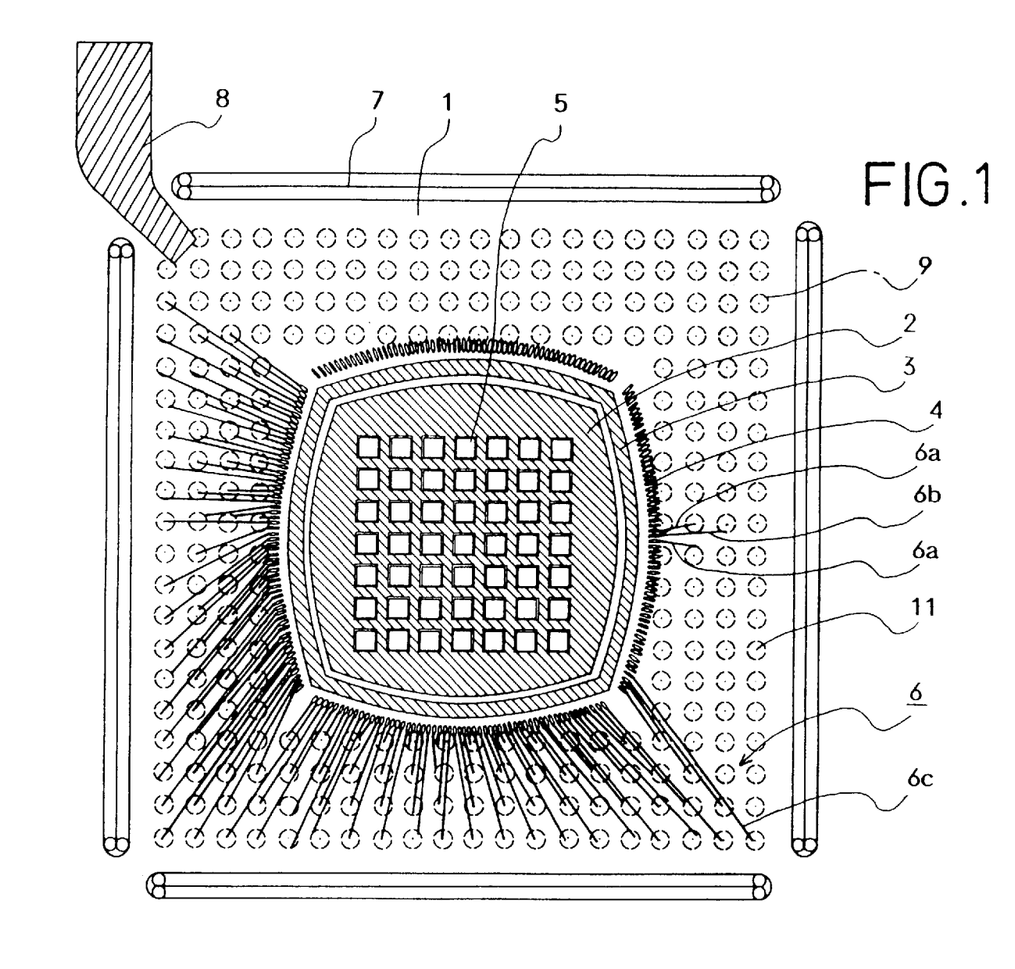
FIG. 1 is an explanation view of the circuit board of an embodiment of the present invention.
Figure 2:
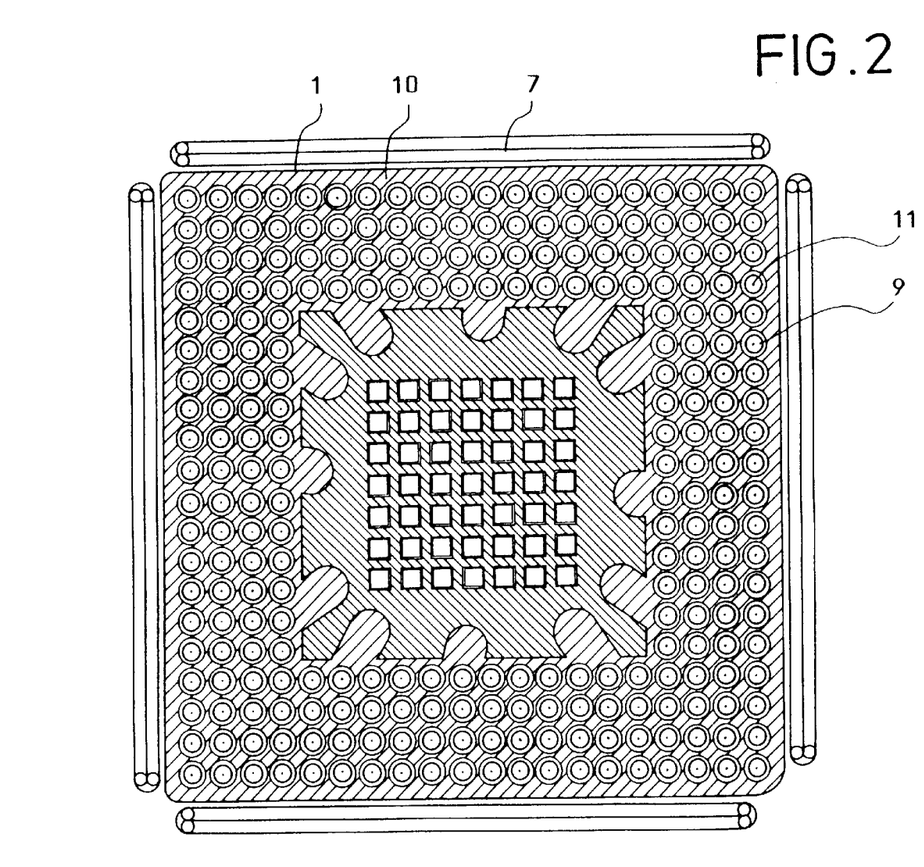
FIG. 2 is a bottom view of the circuit board shown in FIG. 1.

An upper face of the substrate 1 is shown in FIG. 1. The substrate 1 is a woven glass polyimide resin plate, and copper foils are stuck on the both sides of the substrate 1 by heating and pressing. Ordinary thickness of the substrate 1 is 200 μm and/or 400 μm. To avoid the bending caused by heat, the substrate having the thickness of 400 μm is preferably employed.

A die-pad 2 on which a semiconductor chip will be mounted is formed on the upper face of the substrate 1, and an power plane 3 is formed to enclose the die-pad 2. In the die-pad 2, the copper layer is exposed, and the exposed copper layer is used as a common ground plane to which the semiconductor chip and conductor patterns are connected. The semiconductor chip (not shown) will be stuck on the die-pad 2 with silver paste and/or an adhesive. There are formed dent shapes 5 in the die-pad 2 to tightly adhere the semiconductor chip therein, and the die-pad 2 is plated by electroless nickel and gold plating so as to securely bond inner leads of the semiconductor chip. To dissipate heat of the semiconductor chip, thermal holes may be formed in the die-pad 2.

The copper layer is exposed in the power plane 3, and the semiconductor chip and the conductor pattern are commonly connected thereto. There are formed connecting sections 4, which will be connected with the inner leads of the semiconductor chip by wire bonding, around the power plane 3. The connecting sections 4 are plated by the electroless nickel and gold plating so as to securely bond the bonding wires.

Ball pads 9, on which terminals will be formed, are matrically provided on a bottom face of the substrate 1. The ball pads 9 act as the pads. Plated through holes 11 are vertically bored, with respect to the upper and bottom faces, in the substrate 1. Upper ends of the plated through holes 11 respectively open into conductor patterns 6, which are formed on the upper face; lower ends thereof respectively open into the ball pads 9. The inner faces of the plated through holes 11 are plated and coated with copper layers, so that each conductor pattern 6 and each ball pad 9 are directly connected to each other.

In the case of the semiconductor chip driven with high operating frequency, the conductor patterns 6a for clock signals are connected with the ball pads 9 via specific plated through holes 11, which are the nearest plated through holes from the connecting sections 4.

The conductor patterns 6a for clock signals are mutually close but a ground or shield line 6b is located between the conductor patterns 6a for clock signals.

Other lines 6c are also linearly formed to connect the connecting sections 4 with the plated through holes 11. The conductor patterns 6 are formed on the upper face of the substrate 1 by said photo-etching manner. Note that, the conductor patterns 6 are partially shown in FIG. 1.

All conductor patterns 6 are linearly formed, so length of the conductor patterns 6 can be 50% or more shorter than that of the conventional circuit board. Even if the conductor patterns 6a for clock signals are mutually close, electromagnetic fields can be well balanced so that the high frequency performance of the circuit board can be improved because the conductor patterns are linearly formed and the shield line 6b and/or 6c is provided between the conductor patterns for clock signals 6a.

Slot holes 7 are formed to enclose a unit of the circuit board, so that each unit can be separated as single unit of circuit board. A symbol 8 indicates gate of resin path for encapsulating the die-pad 2.

Note that, cavity, in which the semiconductor chip can be mounted, may be formed in the die-pad 2, and heat sink and/or substrate may be adhered on the bottom face of substrate 1 to cover the cavity. Namely, the heat sink and/or substrate covered cavity can act as a die-pad for mounting the semiconductor chip.

Next, the bottom face of the substrate 1 will be explained with reference to FIG. B2. As shown in FIG. 2, a plurality of the ball pads 9 are matrically provided and exposed around an area corresponding to the die-pad 2. Since no conductor patterns for connecting the ball pads 9 are formed on the bottom face of the substrate 1, the impedance of the conductor patterns 6 can be easily adjusted. A broad copper shield pattern 10 is exposed and formed to enclose the ball pads 9. The ball pads 9 are plated by the electroless nickel and gold plating so as to securely adhere solder ball terminals. Note that, the shield pattern 10 and the die-pad 2 (the ground plane) are mutually electrically insulated by solder mask.

By forming the shield pattern 10, a micro strip line structure can be formed between the conductor patterns 6 on the upper face and the shield pattern 10 on the bottom face, so that the impedance characteristic of the circuit board can be improved. Further, the metallic shield pattern 10 can dissipate the heat of the semiconductor chip as a heat sink and prevents the substrate 1 from bending. Thickness of the metallic shield pattern 10 should be 9 μm or more. Thicker shield pattern, for example, 12 μm, 18 μm, 35 μm, 72 μm, can well dissipate the heat and prevent the bending of the substrate 1.

The conductor patterns 6 are formed on the upper face of the substrate 1, and no conductor patterns are formed on the bottom face thereof, so the circuit boards can be efficiently examined, and defective products can be reduced.

The metallic shield pattern 10 may be wholly formed on the bottom face of the substrate 1. And the metallic shield pattern 10 may be a broad ground plane, which is connected with the ball pads 9 which should be connected with the ground plane.

Next, the plated through holes 11 of the substrate 1 will be explained with reference to FIGS. 1 and 2.

The plated through holes 11 are bored in the ball pads 9 which are formed on the bottom face of the substrate 1. The plated through holes 11 are located in the ball pads 9 whose diameter is 200 μm or less; the diameter of the plated through holes 11 is 150 μm or less, preferably 50 to 100 μm. The micro holes 11 may be bored by a fine drill machine, a laser, a plasma etching manner, a chemical etching manner in which potassium permanganate is used, etc. The inner faces of the through holes 11 are plated by the electroless copper plating, electrolytic copper plating and/or electroless nickel and gold plating from the upper ends to lower ends so as to directly connect the conductor pattern 6 and the ball pads 9 without conductor patterns on the bottom face.

Note that, the upper ends of the plated through holes 11 may open not only in the conductor patterns 6 but also at the edges of the conductor patterns 6; the lower ends of the plated through holes 11 may open not only in the ball pads 9 but also at edges of the ball pads 9.

By forming the micro holes 11 and plating the inner faces of the plated through holes 11, the solder ball terminals can be formed with small pitch, for example, 1.5 mm, 1.25 mm, 1.0 mm, 0.8 mm, so that number of the I/O terminals in a unit area can be increased. And the width of the conductor patterns 6 can be narrower, so that impedance characteristic on high frequency signal line can be improved.

In the conventional circuit boards, plating leads of the conductor patterns are essential for the conventional circuit boards to plate the conductor patterns by the electrolytic nickel and gold plating but the plating leads act as antennas and receive noise. In the present embodiment, the plating leads are not required, so these disadvantages can be solved.

Figure 3:
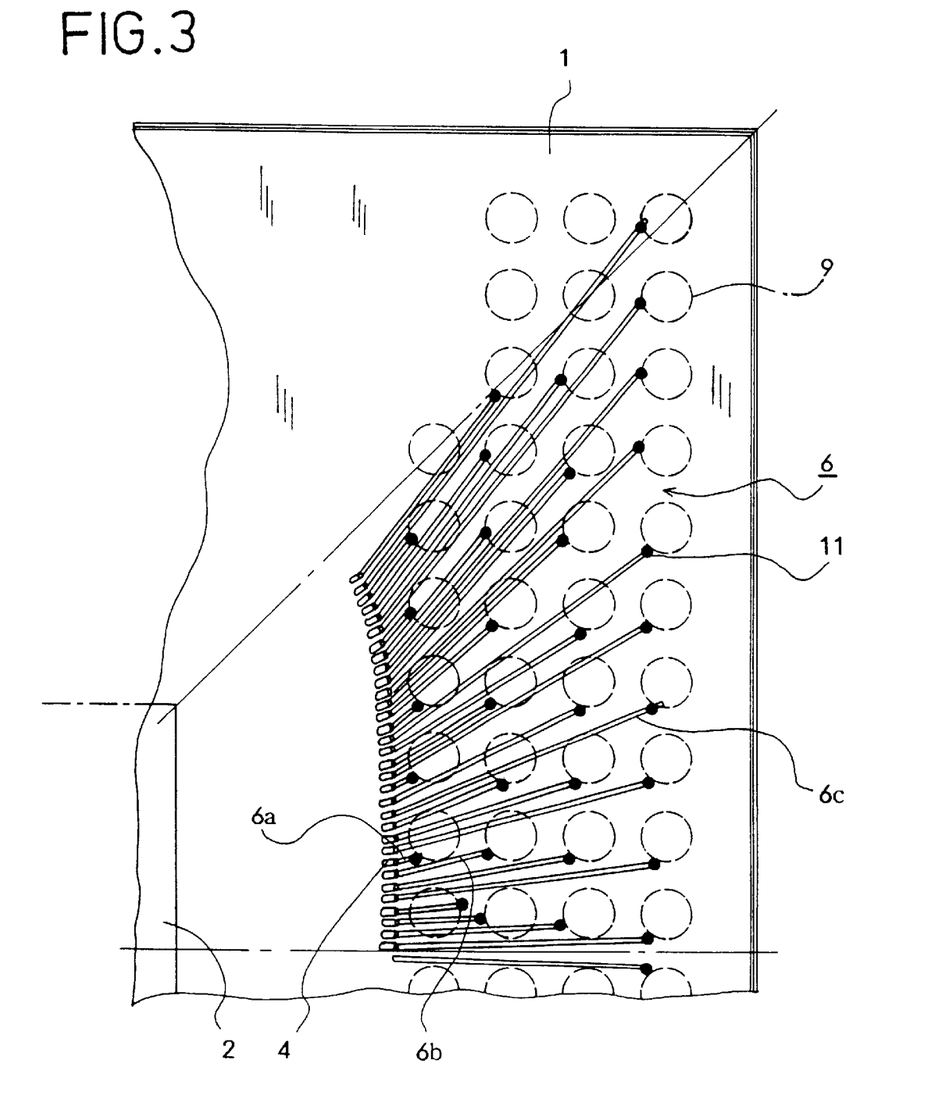
FIG. 3 is a partial explanation view of the circuit board for a semiconductor chip having 256 pins.
Figure 4:
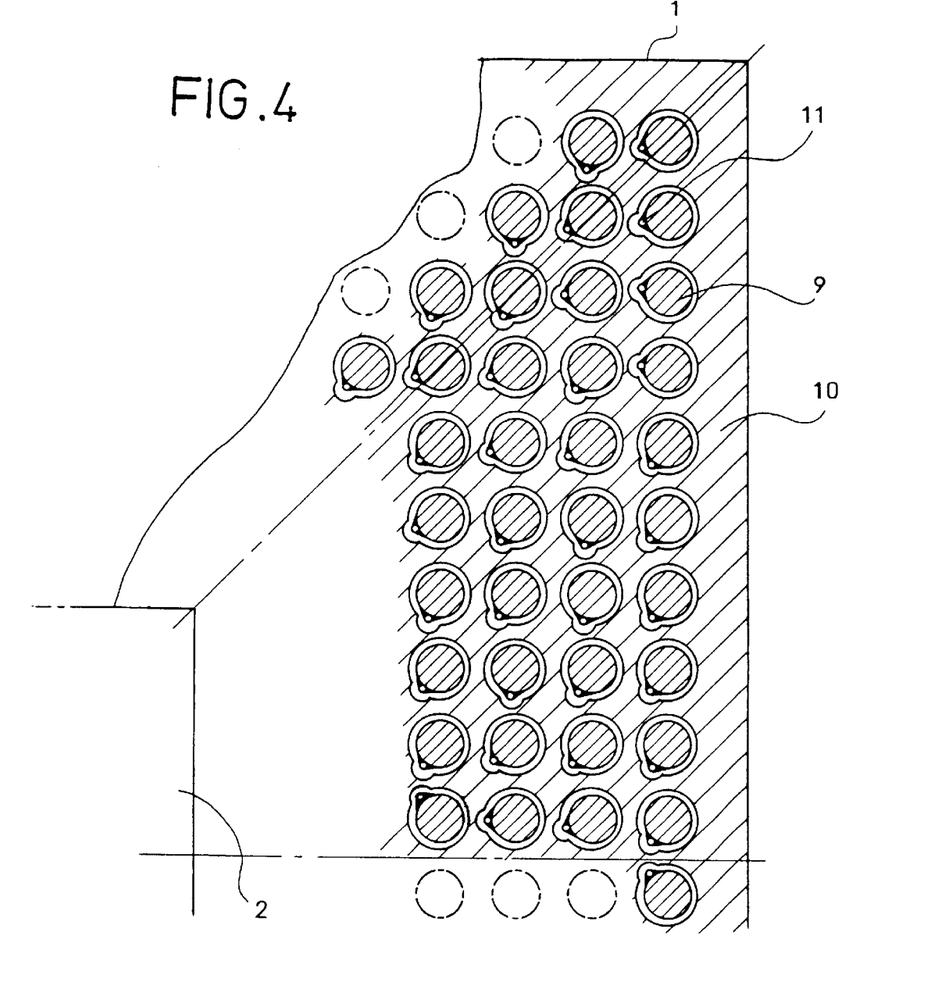
FIG. 4 is a partial bottom view of the circuit board shown in FIG. 3.

A circuit board for the semiconductor chip having 256 pins will be explained with reference to FIGS. 3 and 4. FIG. 3 is a partial (⅛ part) explanation view showing the upper face of the circuit board; FIG. 4 is a partial (⅛ part) bottom view of the circuit board shown in FIG. 3. Elements shown in FIGS. 1 and 2 are assigned the same symbols and explanation will be omitted.

As shown in FIG. 4, the plated through holes 11 electrically connect the edges of the ball pads 9 with the conductor patterns 6.

Figure 5:
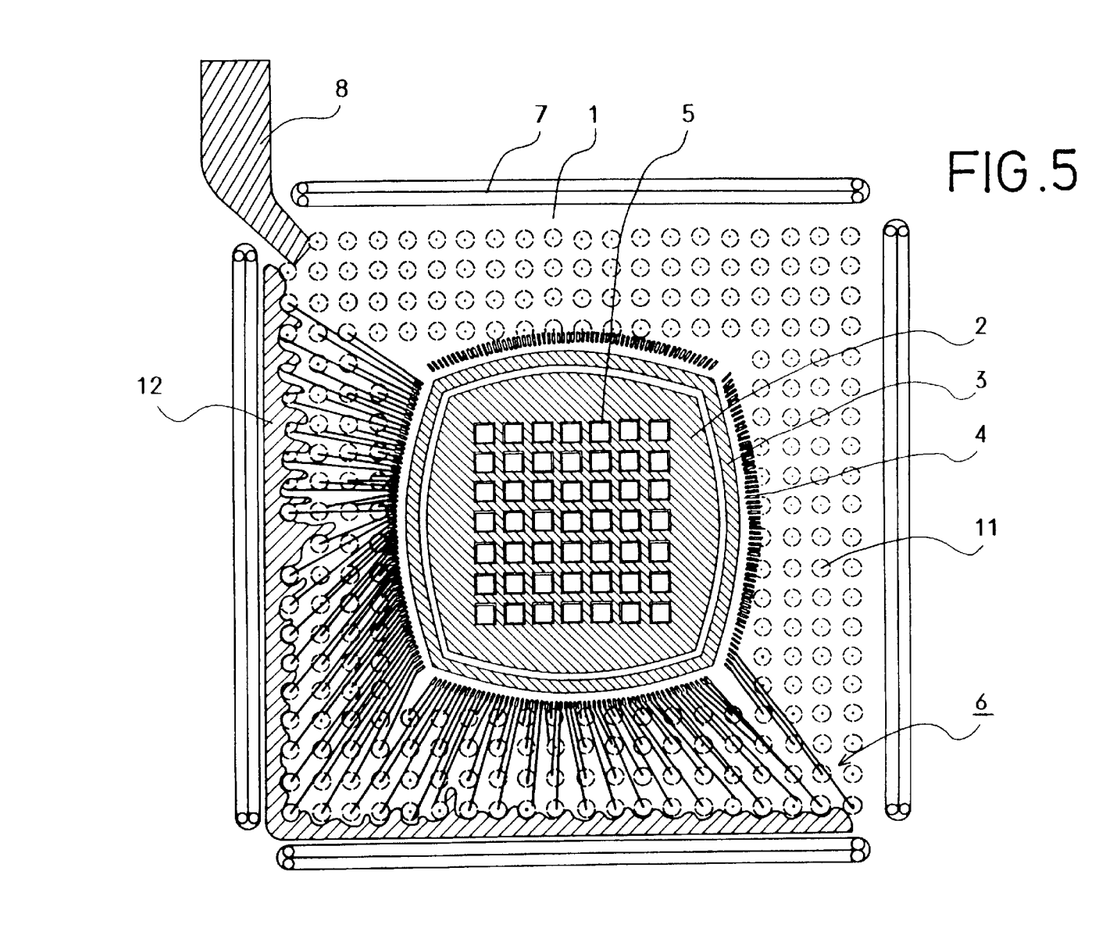
FIG. 5 is an explanation view of the circuit board of another embodiment.

As shown in FIG. 5, a metallic shield pattern 12 may be formed on the upper face of the substrate 1. The metallic shield pattern 12 is formed in an outer edge section of the substrate 1 to enclose the conductor pattern area of the upper face.

Figure 6:
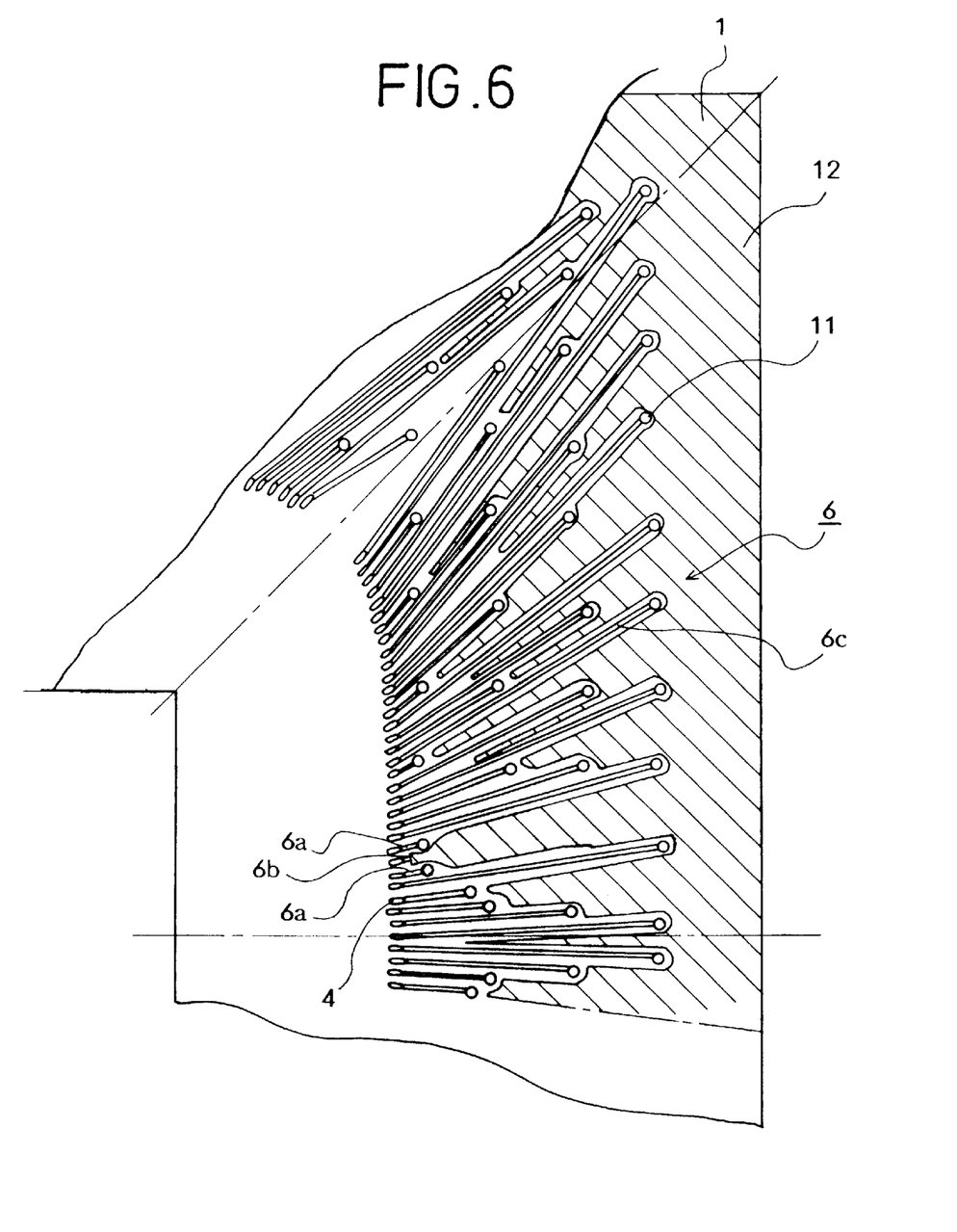
FIG. 6 is a partial explanation view of the circuit board shown in FIG. 5.

As shown in FIG. 6, the metallic shield pattern 12 is formed on the upper face of the substrate 1 for the semiconductor chip having 256 pins as well as the example shown in FIG. 5. The metallic shield pattern 12 may be located between the adjacent conductor patterns 6a for clock signals as shown in FIG. 6. The ground plane 6c are electrically connected to the metallic shield pattern 12 so as to form the ground plane. In this case, the conductor patterns 6 can be effectively shielded from each other, so that high frequency performance can be improved.

Figure 7A:
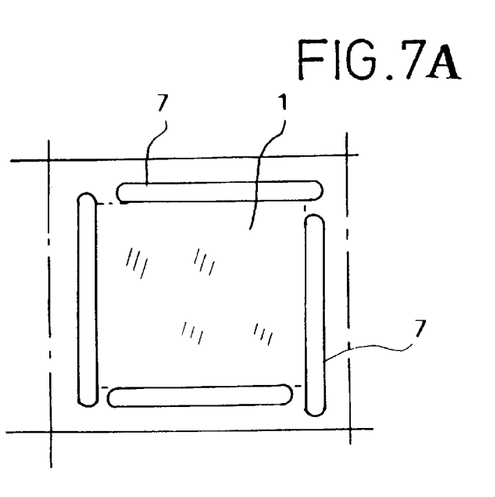
FIGS. 7A and 7B are explanation views of the circuit board of another embodiment.
Figure 7B:
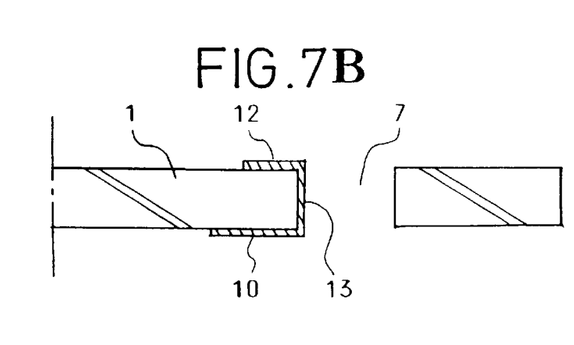

In another embodiment shown in FIGS. 7A and 7B, the length of the slot holes 7 is almost equal to the length of one unit of the circuit board. Third metallic pattern 13 are formed on inner faces of the slot holes 7, which will be side faces of the circuit board after the unit is separated, by plating or painting electric conductive paste. The third metallic pattern 13 electrically connect a first metallic shield pattern 12 on the upper face of the substrate 1 with a second metallic shield pattern 10 thereof (see FIG. 7B). In this case, inductance between the metallic patterns can be reduced. And humidity cannot invade into the substrate 1, so that deformation of the substrate 1 can be prevented.

These days, semiconductor chips are driven by lower voltage, so threshold voltage is also set lower. Namely, the semiconductor chips are apt to be influenced by noises, which are generated in the circuit board or external devices. However, in this embodiment, the side faces of the substrate 1 are shielded by the third metallic patterns 13, which connect the first and second metallic shield patterns 10 and 12, so the noises can be effectively shielded by the metallic patterns 10, 12 and 13. Signal characteristics of the semiconductor chip on the substrate 1 can be improved.

Figure 8:
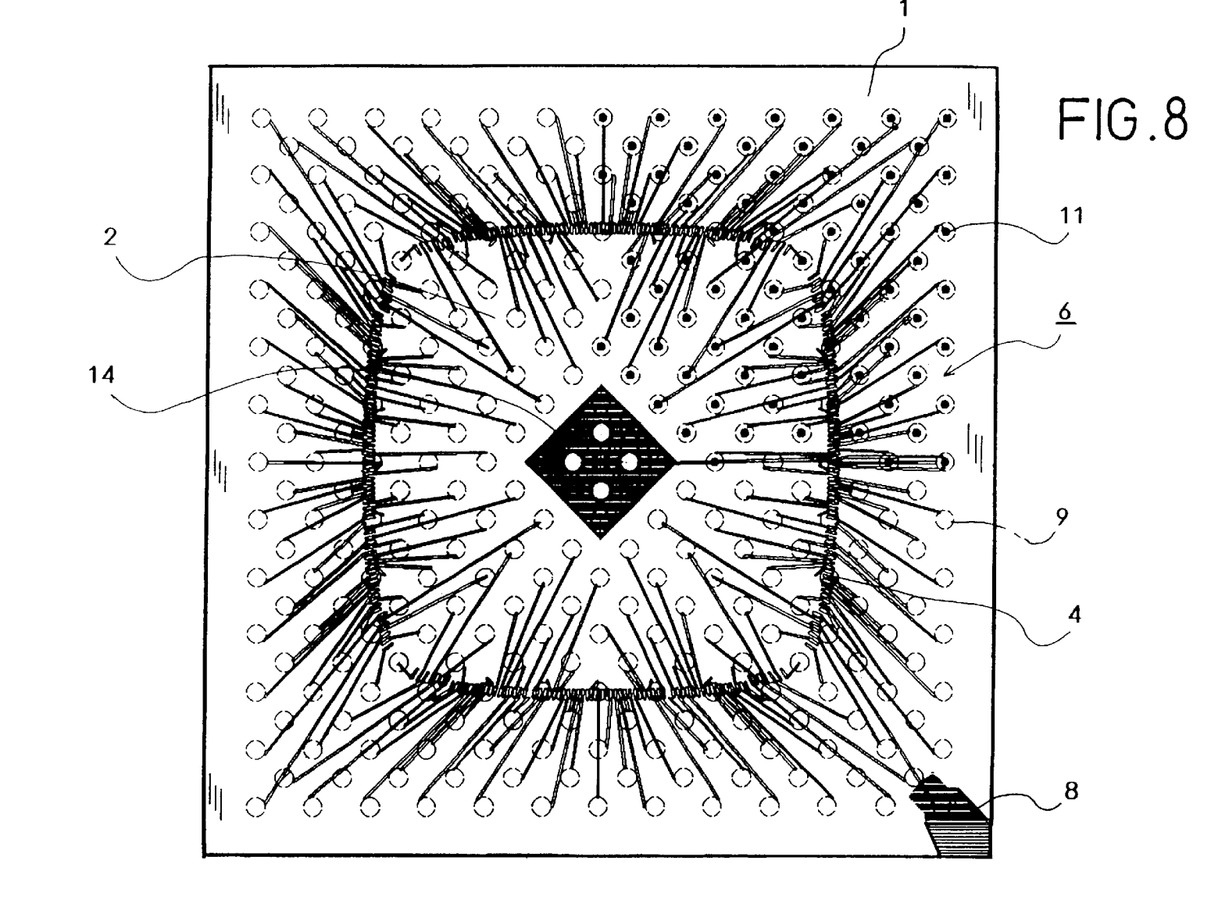
FIG. 8 is an explanation view of the circuit board for a semiconductor chip having 313 pins.

Another circuit board for a semiconductor chip having 313 pins is shown in FIG. 8. The conductor patterns 6 are formed around a chip adhering section 14, which is covered with a solder mask layer, in the die-pad 2. And the plated through holes 11 are bored in the conductor patterns 6. On the bottom face of the substrate 1, many ball pads 9 are formed to correspond to the plated through holes 11. The semiconductor chip may be adhered on the chip adhering section 14 by an epoxy adhesive, for example, and will be connected to the connecting sections 4 by bonding wires. With this arrangement, a space under the semiconductor chip can be effectively used, so that number of the terminals can be increased without employing a broader substrate.

The semiconductor chip on the die-pad 2 will be connected to the ground plane (not shown) on the bottom face of the substrate 1 via the connecting sections 4, the conductor patterns 6, and the plating layers in the plated through holes 11. The ball pads 9 on the bottom face of the substrate 1 may be enclosed by the metallic shield pattern 10. And the metallic shield pattern 10 may act as the ground plane.

In the above described embodiments, the circuit boards are double sided circuit boards, but the present invention may be employed in multilayer, for example, four-layer, circuit boards. The substrate 1 is not limited to the woven glass polyimide resin plate, so a glass-epoxy resin plate, for example, may be employed as the substrate. A plurality of the resin substrates, each of which has the copper layer on the face, may be piled and fixed as a multilayer substrate. The inner faces of the through holes 11, the connecting sections 4, etc. may be plated by electrolytic nickel and gold plating manner. Further, the circuit board of the present invention is not limited to the plastic ball grid array (P-BGA), the present invention may be employed in the cases of circuit boards for plastic packages, e.g., chip size packages (CSP), ceramic packages, etc.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A circuit board comprising a substrate for connecting to a semiconductor chip comprising:
    a plurality of plated through holes, each through hole having an upper end and a lower end, extending through said substrate;
    wherein said substrate has a first face and a second face;
    wherein said first face has a plurality of conductor patterns formed thereon for connecting to said semiconductor chip;
    wherein said conductor patterns include a plurality of adjacent clock lines;
    a first metallic shield layer formed on said first face between said adjacent clock lines;
    a ground line connected with said first metallic shield layer;
    a plurality of terminals formed on a plurality of matrically formed lands formed on said second face;
    a plurality of second metallic shield layers which respectively enclose said lands; and
    wherein said upper ends of said through holes are directly connected to said conductor patterns, and said lower ends of said through holes are directly connected to said lands; and wherein said plated through holes each have inner faces coated with plating layers in order to electrically connect said conductor patterns with said lands.

2. The circuit board according to claim 1, comprising a plurality of connecting sections for connecting to said semiconductor chip, wherein said conductor patterns linearly connect said connecting sections with said one ends of said through holes.

3. The circuit board according to claim 1, wherein said terminals are solder balls on said lands.

4. A circuit board for connecting to a semiconductor chip comprising:

a substrate for connecting to the semiconductor chip, said substrate having a first face and a second face;

a plurality of plated through holes extending through said substrate, each through hole having an upper end and a lower end;

wherein said first face has a plurality of conductor patterns formed thereon for connecting to said semiconductor chip and said second face does not have conductor patterns formed thereon for connecting to said semiconductor chip;

a plurality of adjacent clock line conductor patterns;

a first metallic shield layer formed between said adjacent clock lines on said first face;

a ground line connected with said first metallic shield layer;

a plurality of terminals formed on a plurality of matrically formed lands formed on said second face;

a plurality of second metallic shield layers which respectively enclose said lands; and wherein said upper ends of said through holes open into said conductor pattern, and said lower ends of said through holes open into said lands; and wherein said plated through holes each have inner faces coated with plating layers in order to electrically connect said conductor patterns with said lands.

5. The circuit board according to claim 4, said substrate further comprising:

conductor patterns for shielding;

a ground plane; and said conductor patterns for shielding are connected to said ground plane;

wherein said conductor patterns for shielding are positioned close to said conductor patterns for clock signals.

6. The circuit board according to claim 4, wherein said conductor patterns have connecting sections for connecting to said semiconductor chip; and said one ends of said plated through holes are linearly connected with said connecting sections of said conductor patterns.

* * * * *